United States Patent

Shigaki

[15] 3,702,944

[45] Nov. 14, 1972

[54] PULSE AMPLIFIER

[72] Inventor: Seiichiro Shigaki, Kanagawa, Japan

[73] Assignee: Communication Satellite Corporation, Washington, D.C.

[22] Filed: Feb. 24, 1971

[21] Appl. No.: 118,241

[52] U.S. Cl. ..................307/246, 307/238, 307/268, 328/66

[51] Int. Cl. ............................................H03k 17/56

[58] Field of Search ........328/151, 66; 307/246, 268, 307/238

[56] References Cited

UNITED STATES PATENTS

| | | | |
|---|---|---|---|
| 2,621,263 | 12/1952 | Scoles | 328/151 |
| 3,378,701 | 4/1968 | Frank | 307/246 |
| 3,387,222 | 6/1968 | Hellwarth et al. | 307/246 |
| 3,469,112 | 9/1969 | Hand et al. | 328/151 |
| 3,506,854 | 4/1970 | Guzak | 307/268 |
| 3,527,887 | 9/1970 | Clapp et al. | 307/268 |
| 3,573,502 | 4/1971 | Kan | 307/268 |

*Primary Examiner*—Archie R. Borchelt
*Assistant Examiner*—Harold A. Dixon
*Attorney*—Alan J. Kasper

[57] ABSTRACT

Pulse amplifier for use with a capacitive load which produces output pulses having a short rise and fall time. The amplifier is basically a current-mode-switch having an emitter follower circuit uniquely connected at its output to reduce the storage effect of stray capacitance in the load circuits.

2 Claims, 2 Drawing Figures

SEIICHIRO SHIGAKI
INVENTOR

BY [signature]
ATTORNEY

PULSE AMPLIFIER

BACKGROUND OF THE INVENTION

The subject matter of the present invention is generally concerned with the amplification of pulses having short rise and fall times in applications wherein the amplified pulse must be supplied to a capacitive load. More particularly the invention includes a current-mode-switch having as an input a train of low amplitude pulses which are applied to a load having a substantial stray capacitance. An emitter follower circuit is employed at the output of the current-mode-switch to reduce the transient rise time due to the storage of energy in the stray capacitance of the load.

Digital signals which require less bandwidth than analog signals and are relatively unaffected by the normal distortion and attenuation of the transmission system are frequently used for long distance communication. The digital transmission of analog information is generally accomplished through the steps of (1) digitally encoding the analog signal into a series of information bits which approximate the variable amplitude analog signal, (2) transmitting the digital information, and (3) subsequently decoding the digital bits into a reconstructed analog signal.

The digital encoding of analog information is facilitated by a pulse code modulation (PCM) encoder which initially samples the analog signal at high speed and produces a series of pulse amplitude modulation (PAM) pulses having variable amplitudes which together form a discontinuous approximation of the original signal. Each pulse in the series of pulses is then amplified and quantized, that is compared to reference voltages for conversion into digital signals representative of the amplitude of the pulse. The stream of digital bits is transmitted to a remote receiver where the bits are decoded into a series of PAM signals and the PAM signals are subsequently converted into a reconstructed analog signal.

Although the transmitted digital signal may be satisfactorally reproduced at the receiver, the reconstructed analog signal will not be identical to the original signal due to the coding function performed. Even assuming that a perfectly square PAM pulse is possible, the system is inherently inaccurate due to the PAM signal approximation of the analog signal at the transmitter. In practice this inaccuracy may be magnified by the slow rise and fall times of individual PAM pulses which result in distorted coding and decoding.

The PAM pulses at the transmitter are produced by a sampling circuit which has as one input the analog signal to be transmitted and as a second input a train of sampling pulses which cause periodic sampling of the analog signal. The output of the sampling circuit is a series of amplitude modulated pulses each having a duration equal to the duration of the sampling pulses and an amplitude equal to the amplitude of the analog input wave during each sampling period.

The sampling pulses are produced by a common low amplitude clock pulse source and are amplified by a pulse amplifier circuit for application to the sampling gate. Rise time or fall time distortion of the clock pulse will be amplified by the pulse amplifier and will thereby affect the rise and fall time of the PAM output from the sampling gate. Furthermore, the pulse amplifiers will tend to produce additional distortion of the clock timing pulses due to the effect of stray capacitance in the sampling gate on the rise and fall times of the pulses.

In the prior art, timing pulses for a PAM sampling gate are supplied through a common current-mode-switch acting as a pulse amplifier circuit. A channel timing pulse source is connected to the input of the current-mode-switch which amplifies each timing pulse and applies it to the input of the sampling gate. In general the gate input is inductively coupled to the output of the current-mode-switch through a pulse transformer. The stray capacitance of the inductive pulse transformer tends to round the leading edge of the pulses by creating long transient rise times which results in distortion of the PAM pulses produced by the sampling gate.

The current-mode-switch is a non-linear emitter coupled logic gate which has negative transient enhancement characteristics and is commonly used as an amplifying circuit. These characteristics of the current-mode-switch provide a good fall time for a given input pulse, however, the switch is unable to compensate for the storage effect of stray capacitance in an output circuit.

It is an object of the invention to provide an improved pulse amplifier having a positive transient enhancement characteristic.

It is another object of the invention to provide a short rise time and a short fall time at the output of a pulse amplifier circuit.

It is a further object of the invention to provide a squared pulse input to a sampling gate in a digital transmission system.

DETAILED DESCRIPTION OF THE INVENTION

Figure 1:
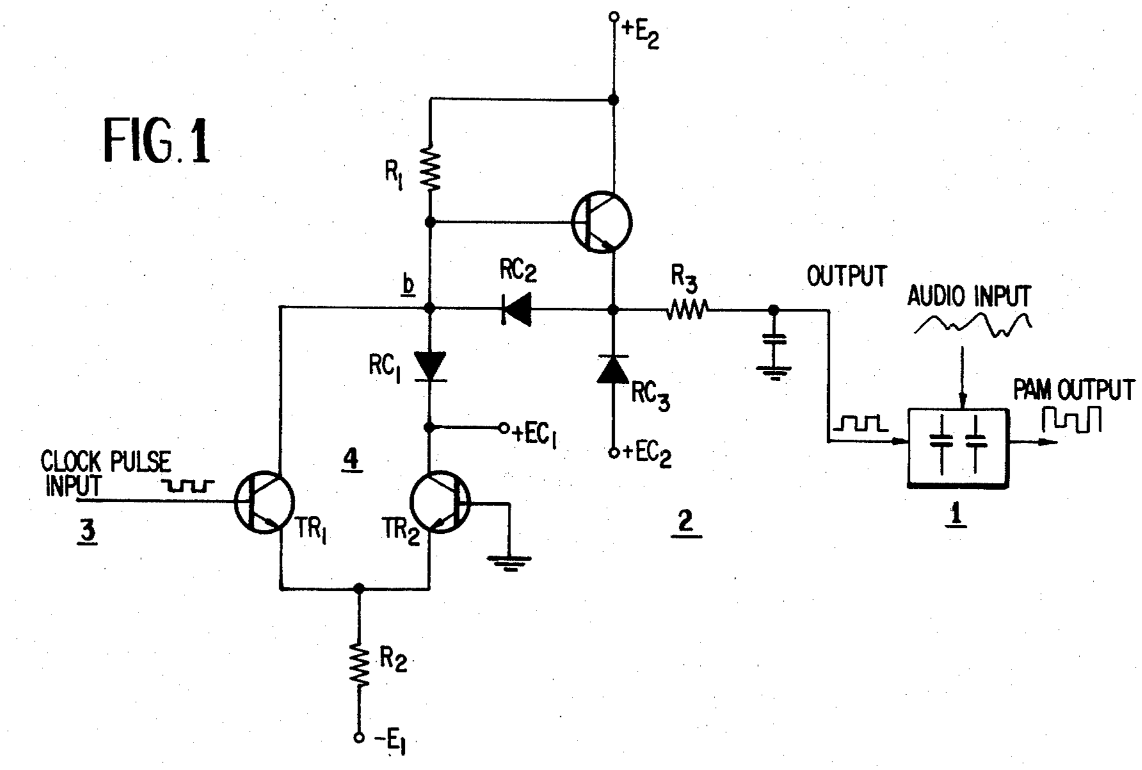
FIG. 1 is a circuit diagram illustrating the invention.

Referring now to FIG. 1 wherein the schematic diagram of a preferred embodiment of the pulse amplifier circuit according to the present invention is shown, an analog input signal which is typically audio information is impressed upon a conventional PAM sampler 1. The PAM sampler produces a series of variable amplitude pulses which together provide a discontinuous approximation of the input analog signal in response to the sampling pulses from a pulse amplifier 2. A source of clock pulses 3 is connected to the input of the pulse amplifier and supplies a train of sampling pulses having a low amplitude and a short duration. The pulses are sufficiently spaced apart in time to allow the digitizing of each PAM output pulse. Each clock pulse is amplified by a current-mode-switch pulse amplifier 4 to a level which is sufficient to allow accurate sampling of the analog voice input signal by sampler 1.

Figure 2:
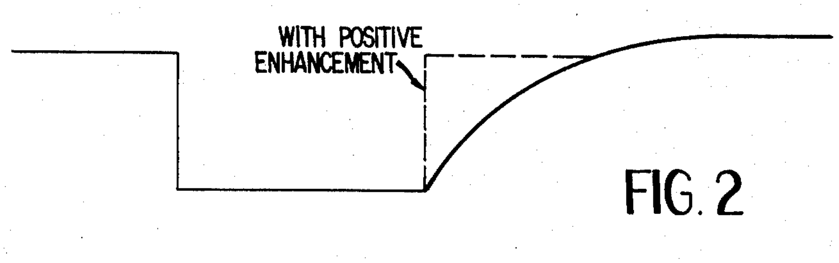
FIG. 2 is a comparison of the amplified pulse waveform with and without the subject invention.

The current-mode-switch is a non-linear, emitter coupled logic gate having a negative transient enhancement characteristic. The current-mode-switch has a polarity inversion characteristic and because of its enhancement properties will tend to provide a fast fall time for a positive input pulse as illustrated in FIG. 2.

The current-mode-switch shown in FIG. 1 consists of two transistors, $TR_1$ and $TR_2$ which have their emitters connected in common to source of potential $-E_1$ through a resistor $R_2$. By using a large negative voltage $-E_1$ and a large resistor $R_2$ such that any voltage excursion at point *a* becomes much less than the voltage $-E_1$, the combination of $R_2$ and $-E_1$ effectively becomes a constant current source. Therefore it is reasonable to assume that current is constantly being supplied to the emitters of transistors $TR_1$ and $TR_2$.

Transistors $TR_1$ and $TR_2$ are current switches which mutually exclusively transmit current from their emitter to their collector terminals in response to the relative magnitude of input signals at the base terminals of the two transistors. The flow of current through the respective transistors $TR_1$ or $TR_2$ will determine the magnitude of the voltage at the output terminal of the current-mode-switch amplifier. Amplification of an input pulse is provided by properly biasing the output paths of transistors $TR_1$ and $TR_2$. For the circuit shown in FIG. 1, the bias voltage $EC_1$ is larger than the bias voltage $EC_2$.

For purposes of this analysis we shall assume that all elements in the disclosed circuit are silicon elements having a known voltage drop across the diode junction of the N and P interface. However, it will be obvious to one of ordinary skill in the art that it is within the scope of this invention to substitute other similar diode devices such as germanium crystals which will also exhibit a known voltage drop across the interface of the device.

The base of $TR_2$ is connected to a reference voltage which is shown as ground in FIG. 1 but may be any referenced voltage having the proper relative value to the input voltages at $TR_1$. The base of $TR_1$ is connected as the input terminal of the current-mode-switch and receives a train of pulses having peak and valley amplitudes which vary around the D.C. reference voltage applied to the base of $TR_2$.

If we assume that the base of $TR_2$ is connected to ground and that initially $TR_2$ is conducting due to a low input of $TR_1$, current will flow from the constant current source $-E_1$ and $R_2$ through the emitter and collector of $TR_2$ to the output of the transistor. The base to emitter voltage drop in transistor $TR_2$ will be the standard voltage drop across a silicon diode of approximately 0.7 volts causing the voltage at point *a* to become $-0.7$ volts. Since the input to $TR_1$ is low, that is, below the reference level of the base at $TR_2$, the voltage drop from the base to the emitter of $TR_1$ tending to forward bias the base to emitter diode will be relatively small or even negative if the input signal is sufficiently negative. Since a minimum forward bias is required to cause conduction, the small forward bias will be of insufficient magnitude to turn on the base to emitter diode and cause current to flow.

For a low input to $TR_1$, the voltage at the collector of transistor $TR_2$ will be held at $+EC_1$ volts due to the current from bias voltage source $EC_1$. The voltage at junction *b* will be equal to the bias voltage $EC_1$ plus one diode drop across $RC_1$. The base of transistor $TR_3$ is directly connected to junction *b* and the emitter of $TR_3$, at the pulse amplifier output, will be at $EC_1$ volts due to the voltage drop across the base to emitter diode. Transistor $TR_3$, which provides positive edge enhancement, also maintains the output voltage at $EC_1$ by passing current from $E_2$ whenever the output voltage falls below $EC_1$. Since bias $EC_2$ is smaller than bias $EC_1$, the magnitude of the voltage at the output reverse biases diode $RC_2$ and $RC_3$ and prevents any flow of current from bias $+EC_2$ to the output. Thus, for a low input to $TR_1$ the output of the current-mode-switch is inverted and is maintained at a high level by $TR_3$ until the input to $TR_1$ is raised to a level which will turn $TR_1$ "on" and turn $TR_2$ "off".

When the input pulse at the base of $TR_1$ goes high, the base to emitter diode in transistor $TR_1$ becomes forward biased above its minimum threshold voltage and begins to conduct current, thereby raising the voltage at point *a*. The rapid rise in voltage at point *a* will tend to reduce the voltage drop across the base to emitter diode of transistor $TR_2$ below the minimum forward bias threshold and thereby cut off transmission of current from the emitter to the collector of transistor $TR_2$. During this high input, when the input to $TR_1$ is greater than the reference voltage at $TR_2$, the current flows from the constant current source through $TR_1$ to the output of $TR_1$ and cannot flow through $TR_2$.

The transfer of current flow from $TR_2$ to $TR_1$ occurs at high speed due to the negative enhancement characteristics of the amplifier and causes the voltage at junction *b* to drop rapidly from its original value of $EC_1$ $+0.7$ volts towards ground. As the voltage at *b* drops rapidly, the base-emitter junction of $TR_3$ will become back biased and $TR_3$ will turn off rapidly. However, the bias $+EC_2$ will tend to clamp the junction *b* to a value of $+EC_2 - 1.4$ volts (diode drops across $RC_2$ and $RC_3$) such that, as the junction b tends to go below that value, bias voltage $+EC_2$ will supply current to maintain the voltage at junction *b* constant. No current can flow through $TR_2$ and since $+EC_1$ is greater than $+EC_2$, the diode $RC_1$ will be back biased and will not pass current. Current will therefore flow to $TR_1$ from the bias $+E_2$ through $R_1$, from bias $+EC_2$ through $RC_3$ and $RC_2$ and from the load through $RC_2$ to maintain the value of the voltage at the output terminal at $+EC_2$ minus one diode drop. The voltage drop across $RC_2$ will hold a back bias on $TR_3$ and $TR_3$ will be non-conductive for low level output signals.

It can be seen that for a given magnitude of input voltage, current will flow through one transistor and not through the other transistor of the current-mode-switch, while for a change in the magnitude of input voltage, current will switch its path to flow through the second transistor and not through the first transistor. Since the magnitude of the bias voltages $+EC_1$ and $+EC_2$ are greater than the magnitude of the input pulse which is applied to the base of transistor $TR_1$, and amplifying effect is achieved.

The effect of stray capacitance at the output terminal may be seen by examining the output voltages of the current mode switch amplifier as shown in FIG. 1. If the input is low and $TR_2$ is conducting, the output voltage will be at a high value of $+EC_1$. The stray capacitance at the output terminal stores the voltage appearing at the output with a time constant which is dependent upon the values of the stray capacitance $C_s$ and the load resistance $R_3$. This stored voltage will be maintained until the input to $TR_1$ is raised to a high level at which point the stored voltage discharges through $RC_2$ and $TR_1$ and immediately causes the output to drop to $+EC_2$ minus one diode drop volts. The output remains at this low level for the high input to $TR_1$ until the application of another low input pulse to $TR_1$.

In the prior art, when the input was high and became low, the output voltage of the current mode switch would rise to $EC_1$. However, since the voltage at the output to the current mode switch was low (approximately $EC_2$) and the new value of voltage at the junction *b* is high (approximately $EC_1$), the diode $RC_2$ is back biased until the stray capacitance $C_s$ can be charged to the voltage equal to $+EC_1$ over a time period dependent upon $C_s$ and $R_3$ of the output circuits. The time taken to charge the stray capacitance causes the rise time of the output pulse to be delayed significantly, thereby rounding the corners of the resulting pulse and causing serious distortion in the output circuit as seen in FIG. 2.

The present invention solves the problem by providing a high source of current through $TR_3$ to the output load. The current compensates the back biasing of diode $RC_2$ by quickly supplying current to the stray capacitance and thereby reducing the rise time of the output voltage. Since the bias voltage $+E_2$ is nearly an infinite source of current, an emitter follower transistor is connected as a switch between the voltage source $+E_2$ and the output with its base connected to the junction *b* as shown in FIG. 1. Upon application of a proper signal to the base, it can be seen that current will flow from the source of bias potential $+E_2$ directly to the output through the collector and emitter terminals of the transistor $TR_3$. When $TR_2$ is turned on, voltage at junction b jumps from $+EC_2$ to $+EC_1$. This high voltage at the base of $TR_3$ causes $TR_3$ to turn on and connects $+E_2$ to the output. The voltage at the output rises rapidly until it reaches $+EC_1$ whereupon the base to emitter diode of $TR_3$ becomes less forward biased and turns $TR_3$ off. The transistor remains in a standby state and conducts current to the output whenever the voltage at the output drops below the voltage at junction *b* minus one diode drop. The present invention employs the emitter follower to rapidly supply current to the output during the positive transient period of the output pulse.

Once a high voltage is again impressed upon the transistor $TR_1$ the current mode switch changes state causing the current of $TR_1$ to flow. The current through $TR_2$ is cut off and the stray capacitance voltage is discharged through $RC_1$ and $TR_1$. The amplified output pulse will rapidly drop to its low level in a short fall time and square the following edge of the amplified pulse.

Although the invention has been disclosed as a pulse amplifier for a PAM sampler it would be obvious to one of ordinary skill in the art that this pulse amplifier may be used in any applications requiring high amplitude pulses having short rise and fall times.

I claim:

1. An improved pulse amplifier having an input terminal and an output terminal and supplying a capacitive load comprising:

a. a logic gate connected to said input terminal including a first transistor emitter coupled to a second transistor, b. a first voltage source connected to the output of said second transistor, c. first diode means connected between said first voltage source and the output of said logic gate, d. a second voltage source having a voltage significantly less than said first voltage source, e. second diode means connected between said second voltage source and said output terminal, f. third diode means connected between said first diode means and said output terminal, said first transistor being biased so as to be rendered conductive by positive going pulses at said input terminal to cause said second and third diode means to conduct thereby maintaining the voltage of said output terminal substantially at the value of said second voltage source and said second transistor being biased so as to be rendered conductive by negative going pulses at said input terminal to cause said first diode means to conduct and said second and third diode means to cease conducting thereby maintaining the voltage at said output terminal substantially at the value of said first voltage source, g. current supply means, and h. an emitter follower current switch connected between said current supply means and said output terminal, said switch being responsive to a rise in voltage at the output of said logic gate to pass current from said current source to said capacitive load thereby reducing the rise time of the output pulse.

2. The amplifier as claimed in claim 1 wherein said logic gate includes means to increase the fall time of said output pulse.

* * * * *